US010266762B2

(12) United States Patent
He et al.

(10) Patent No.: US 10,266,762 B2
(45) Date of Patent: *Apr. 23, 2019

(54) NITROGEN-CONTAINING LUMINESCENT PARTICLE AND METHOD FOR PREPARING SAME, NITROGEN-CONTAINING ILLUMINANT, AND LUMINESCENT DEVICE

(71) Applicant: JIANGSU BREE OPTRONICS CO., LTD, Jiangsu (CN)

(72) Inventors: Jinhua He, Jiangsu (CN); Xiaoming Teng, Jiangsu (CN); Chao Liang, Jiangsu (CN); Yibing Fu, Jiangsu (CN)

(73) Assignee: Jiangsu Bree Optronics Co., Ltd (CN)

( * ) Notice: Subject to any disclaimer, the term of this patent is extended or adjusted under 35 U.S.C. 154(b) by 258 days.

This patent is subject to a terminal disclaimer.

(21) Appl. No.: 15/125,047

(22) PCT Filed: Mar. 4, 2016

(86) PCT No.: PCT/CN2016/075583
§ 371 (c)(1),
(2) Date: Sep. 9, 2016

(87) PCT Pub. No.: WO2017/128493
PCT Pub. Date: Aug. 3, 2017

(65) Prior Publication Data
US 2017/0369774 A1   Dec. 28, 2017

(30) Foreign Application Priority Data
Jan. 29, 2016   (CN) .......................... 2016 1 0067064

(51) Int. Cl.
*F21V 9/30* (2018.01)
*C01B 21/06* (2006.01)
(Continued)

(52) U.S. Cl.
CPC ...... *C09K 11/0883* (2013.01); *C01B 21/0602* (2013.01); *C01B 21/0823* (2013.01);
(Continued)

(58) Field of Classification Search
CPC ............ C09K 11/0883; C09K 11/7706; C09K 11/7734; H01L 33/502; H01L 33/504
See application file for complete search history.

(56) References Cited

U.S. PATENT DOCUMENTS 7,431,864 B2 * 10/2008 Hirosaki ............... C04B 35/581
                                                            252/301.4 F
7,780,872 B2 *  8/2010 Hirosaki ............... C04B 35/584
                                                            252/301.4 F
9,909,061 B1 *  3/2018 He ...................... C09K 11/0883

FOREIGN PATENT DOCUMENTS

CN       1918262 A      2/2007
CN     103305215 A      9/2013
(Continued)

OTHER PUBLICATIONS

PCT/CN2016/075583 International Search Report and Written Opinion of State Intellectual Property Office of the P.R.C. dated Sep. 23, 2016, 8 pp.
(Continued)

*Primary Examiner* — C Melissa Koslow
(74) *Attorney, Agent, or Firm* — Edwin S. Flores; Chalker Flores, LLP

(57) ABSTRACT

The present invention discloses a nitrogen-containing luminescent particle, characterized in that a structure of the nitrogen-containing luminescent particle is divided into an oxygen poor zone, a transition zone, and an oxygen rich zone from a core to an outer surface of the particle depending on an increasing oxygen content, the oxygen poor zone being predominantly a nitride luminescent crystal or oxygen-containing solid solution thereof, the transition zone
(Continued)

being predominantly a nitroxide material, the oxygen rich zone being predominantly an oxide material or oxynitride material; the nitride luminescent crystal or oxygen-containing solid solution thereof has a chemical formula of $M_{m-m1}A_{a1}B_{b1}O_{o1}N_{n1}{:}R_{m1}$, the nitroxide material has a chemical formula of $M_{m-m2}A_{a2}B_{b2}O_{o2}N_{n2}{:}R_{m2}$, the oxide material or oxynitride material has a chemical formula of $M_{m-m3}A_{a3}B_{b3}O_{o3}N_{n3}{:}R_{m3}$. The nitrogen-containing luminescent particle and the nitrogen-containing illuminant of the present invention have good chemical stability, good aging and light decay resistance, and high luminescent efficiency, and are useful for various luminescent devices. The manufacturing method of the present invention is easy and reliable, and useful for industrial mass production.

12 Claims, 8 Drawing Sheets

(51) Int. Cl.
| | |
|---|---|
| *C09K 11/08* | (2006.01) |
| *C09K 11/55* | (2006.01) |
| *C09K 11/59* | (2006.01) |
| *C09K 11/64* | (2006.01) |
| *C09K 11/77* | (2006.01) |
| *H01L 33/50* | (2010.01) |
| *C01B 21/082* | (2006.01) |

(52) U.S. Cl.
CPC ...... *C09K 11/0816* (2013.01); *C09K 11/0822* (2013.01); *C09K 11/55* (2013.01); *C09K 11/592* (2013.01); *C09K 11/64* (2013.01); *C09K 11/7734* (2013.01); *F21V 9/30* (2018.02); *H01L 33/50* (2013.01); *C01P 2002/72* (2013.01); *C01P 2002/84* (2013.01); *C01P 2004/03* (2013.01)

(56) References Cited

FOREIGN PATENT DOCUMENTS

| | | |
|---|---|---|
| EP | 1609839 A2 | 12/2015 |
| WO | 2017128492 A1 | 3/2017 |

OTHER PUBLICATIONS

Watanabe, et al., "Synthetic method and luminescence properties of SrxCa1-xAlSiN3:Eu2+ mixed nitride fluorescent powders." Journal of The Electrochemical Society, 2008, vol. 155, No. 3, pp. F31-F36.
Zhang, et al., "Reduced thermal degradation of the red-emitting Sr2Si5N8:Eu2+ fluorescent powder via thermal treatment in nitrogen." Journal of Materials Chemistry C, 2015, vol. 3, pp. 7642-7651.

* cited by examiner

NITROGEN-CONTAINING LUMINESCENT PARTICLE AND METHOD FOR PREPARING SAME, NITROGEN-CONTAINING ILLUMINANT, AND LUMINESCENT DEVICE

CROSS-REFERENCE TO RELATED APPLICATIONS

This application is the National Stage of International Application No. PCT/CN2016/075583, filed on Mar. 4, 2016, claiming the priority of CN 201610067064.2 filed on Jan. 29, 2016, the content of each of which is incorporated by reference herein.

BACKGROUND OF THE INVENTION

Field of the Invention

The present invention relates to LED fluorophors and luminescent devices, and more particularly to a nitrogen-containing luminescent particle capable of being effectively excited with UV light, violet light, or blue light and method for preparing a same, a nitrogen-containing illuminant, and a luminescent device.

Description of Related Art

Nowadays, the semi-conductor lighting electric light source represented by light emitting diodes (LEDs) is touted as the fourth-generation lighting electric light source following incandescent lamps, fluorescent lamps, and energy-saving lamps, and is known as "the green light source in the 21st century".

As semi-conductor lighting is used in the field of general lighting, it is pressing to accelerate the development of white LEDs of high color rendering, anti-aging, and low light decay. Current methods of manufacturing a white LED mainly include the following. 1. Application of a yellow fluorescent powder (YAG) on a blue LED chip to effect emission of white light; however, the YAG fluorescent powder has the disadvantages of relatively high color temperature and relatively low color rendering index, which cannot meet the requirements of semi-conductor lighting; although the emission spectrum of the YAG fluorescent powder is very wide, the emission intensity in a red region is very weak, which results in the lack of red light after mixing with the blue LED chip, thereby affecting related color temperature and color rendering index of the white LED. 2. Application of green and red fluorescent powders on a blue LED chip to solve the problem above; however, the red fluorescent powder also has numerous problems such as large light decay and poor chemical stability of $CaS:Eu^{2+}$, narrow excitation range of $CaMoO_4:Eu^{2+}$, weak absorption and low energy conversion efficiency in a blue region of $Y_2O_3:Eu^{3+}$ and $Y_2O_2S:Eu^{3+}$, and poor light decay resistance of $M_2Si_5N_8:Eu^{2+}$, which all cannot be ideally matched to the LED chip, thus restricting the development of the white LED technology. 3. Introduction of a nitride fluorescent powder of $CaAlSiN_3$ crystal structure; although the overall performance is superior to the above-mentioned YAG fluorescent powder and common red fluorescent powder, the nitride fluorescent powder has significant drawbacks in that: (1) because diffusion of components, nucleation, and preferential growth orientation as well as primary crystallite size in the fluorescent powder synthesis process have not been fully understood, resulting in relatively low luminescent efficiency of the fluorescent powder, the luminescent efficiency needs to be further improved; and (2) because the fluorescent powder may degrade under a combined action of three factors, high optical density, high temperature, and high moisture, directly resulting in decreased overall light effect, and particularly substantial drifting in color coordinates, the durability of the fluorescent powder still cannot fully meet the requirements of common lighting.

A fluorophor is disclosed in CN patent 200480040967.7, comprising an inorganic compound having the same crystal structure as $CaAlSiN_3$. This solution uses a fluorophor with a nitrogen- and oxygen-containing inorganic compound as a matrix, and it is particularly emphasized that because the luminance brightness decreases with the increase of oxygen added, a small amount of oxygen added is preferred, and that in order to obtain good high-temperature durability, the atom numbers of O and N contained in the inorganic compound should meet $0.5 \leq N/(N+O) \leq 1$ (see paragraphs 161 and 271 therein). An obvious disadvantage of this solution is that the range of oxygen content is limited in order to maintain the luminance brightness of the fluorescent powder, so that the durability of the fluorophor is reduced.

The preparation of $(Sr,Ca)AlSiN_3$ red fluorescent powder using alloy process is proposed in "Synthetic method and luminescence properties of $Sr_xCa_{1-x}AlSiN_3:Eu^{2+}$ mixed nitride fluorescent powders" published in J. Electrochem. Soc., 2008. Compared to fluorescent powder synthesis using a nitride as a starting material, this method results in lower oxygen content, such that the preparation of $(Sr,Ca)AlSiN_3$ red fluorescent powder using alloy process has better consistency and phase purity as well as good stability. However, this method still has a significant drawback in that: because it is highlighted for the $(Sr,Ca)AlSiN_3$ red fluorescent powder prepared by the alloy process to control low oxygen content in order to achieve high consistency and phase purity, the fluorescent powder has significantly reduced durability and thus poor utility, thus limiting its application.

In "Reduced thermal degradation of the red-emitting $Sr_2Si_5N_8:Eu^{2+}$ fluorescent powder via thermal treatment in nitrogen" published in Journal of Materials Chemistry C, 2015, the mechanism of thermal degradation of $Sr_2Si_5N_8:Eu^{2+}$ is discussed. It is thought that by forming a layer of protective oxide film on a surface of the fluorescent powder through calcination, the oxidation of $Eu^{2+}$ is prevented and the thermal degradation is improved, and thus it is assumed that the applicability of $Sr_2Si_5N_8:Eu^{2+}$ in LEDs can be improved, which, however, is not supported by any experimental data. Thus, the long-term aging problem of $Sr_2Si_5N_8:Eu^{2+}$ is not fundamentally solved. In fact, in this system, due to poor stability of $Sr_2Si_5N_8:Eu^{2+}$ itself, the crystal structure on the surface is destroyed during the calcination, so that the fluorescent powder has significantly decreased luminescent intensity, and thus has no practical application value.

Taken together, in the prior art, there is a trade-off between the aging and light decay resistance of the nitride fluorescent powder and the luminescent efficiency of the fluorescent powder. That is to say, generally, the aging and light decay resistance of the fluorescent powder is improved at the expense of the luminescent efficiency of the fluorescent powder, or the luminescent efficiency of the fluorescent powder is improved at the expense of the aging and light decay resistance of the fluorescent powder. At present, there is no comprehensive solution that realizes the improvement of the aging and light decay resistance of the fluorescent powder without reducing the luminescent efficiency of the fluorescent powder. Thus, how to overcome the shortcomings in the prior art has become a major problem to be solved in the technical field of LED fluorophors and luminescent devices currently.

SUMMARY OF THE INVENTION

An object of the present invention is to provide a nitrogen-containing luminescent particle and method for preparing a same, a nitrogen-containing illuminant, and a luminescent device, in order to the shortcomings in the prior art. The nitrogen-containing luminescent particle and the nitrogen-containing illuminant of the present invention have the advantages of good chemical stability, good aging and light decay resistance, and high luminescent efficiency, and are useful for various luminescent devices. The manufacturing method of the present invention is easy and reliable, advantageous for improving chemical and physical stabilities of the nitrogen-containing luminescent particle and the nitrogen-containing illuminant, and useful for industrial mass production.

A nitrogen-containing luminescent particle according to the present invention is characterized in that a structure of the nitrogen-containing luminescent particle is divided into an oxygen poor zone, a transition zone, and an oxygen rich zone from a core to an outer surface of the particle depending on an increasing oxygen content, the oxygen poor zone being predominantly a nitride luminescent crystal or oxygen-containing solid solution thereof, the transition zone being predominantly a nitroxide material, the oxygen rich zone being predominantly an oxide material or oxynitride material; the nitride luminescent crystal or oxygen-containing solid solution thereof has a chemical formula of $M_{m-m1}A_{a1}B_{b1}O_{o1}N_{n1}:R_{m1}$, the nitroxide material has a chemical formula of $M_{m-m2}A_{a2}B_{b2}O_{o2}N_{n2}:R_{m2}$, the oxide material or oxynitride material has a chemical formula of $M_{m-m3}A_{a3}B_{b3}O_{o3}N_{n3}:R_{m3}$; in the chemical formulas, the M element is at least one of Mg, Ca, Sr, Ba, Zn, Li, Na, K, Y, and Sc, the A element is at least one of B, Al, Ga, and In, the B element is at least one of C, Si, Ge, and Sn, R is at least one of Ce, Pr, Nd, Sm, Eu, Gd, Tb, Dy, Ho, Er, Tm, Yb, and Lu, wherein $0.5 \leq m \leq 1.5$, $0.001 \leq m1 \leq 0.2$, $0.5 \leq a1 \leq 1.5$, $0.5 \leq b1 \leq 1.5$, $0 \leq o1 \leq 0.5$, $2.5 \leq n1 \leq 3.5$, $0 \leq m2 \leq 0.2$, $0.5 \leq a2 \leq 1.5$, $0.5 \leq b2 \leq 1.5$, $0.1 \leq o2 \leq 4$, $0.1 \leq n2 \leq 3$, $0 \leq m3 \leq 0.2$, $0.5 \leq a3 \leq 1.5$, $0.5 \leq b3 \leq 1.5$, $3 \leq o3 \leq 5$, $0 \leq n3 \leq 0.5$.

A nitrogen-containing illuminant according to the present invention is characterized by comprising a mixture of the nitrogen-containing luminescent particle as described above and other crystalline grains or non-crystalline particles, the nitrogen-containing luminescent particle being present in the mixture at a proportion of no less than 50 wt %.

A method 1 for preparing a nitrogen-containing luminescent particle according to the present invention is characterized by comprising the following basic steps:

step 1: weighting desired starting materials at a stoichiometric ratio of cations in the composition of a chemical formula $M_{m-m1}A_{a1}B_{b1}O_{o1}N_{n1}:R_{m1}$, with a nitride, oxide or halide of M, A, B, and R as starting materials;

step 2: uniformly mixing the starting materials weighted in the step 1 in a nitrogen atmosphere to form a mix;

step 3: subjecting the mix obtained in the step 2 to high-temperature calcination in a calcination atmosphere, followed by low-temperature calcination at a reduced predetermined temperature in a nitrogen-oxygen mixture or air atmosphere, to give a nitrogen-containing luminescent particle semi-product; and step 4: subjecting the nitrogen-containing luminescent particle semi-product obtained in the step 3 to a post-treatment, to give a nitrogen-containing luminescent particle product.

A method 2 for preparing a nitrogen-containing luminescent particle according to the present invention is characterized by comprising the following basic steps:

step 1: weighting desired starting materials at a stoichiometric ratio of cations in the composition of a chemical formula $M_{m-m1}A_{a1}B_{b1}O_{o1}N_{n1}:R_{m1}$, with a nitride, oxide or halide of M, A, B, and R as starting materials;

step 2: uniformly mixing the starting materials weighted in the step 1 in a nitrogen atmosphere to form a mix;

step 3: subjecting the mix obtained in the step 2 to high-temperature calcination in a calcination atmosphere, to give a nitrogen-containing luminescent particle semi-product;

step 4: subjecting the nitrogen-containing luminescent particle semi-product obtained in the step 3 to a post-treatment; and step 5: subjecting the nitrogen-containing luminescent particle obtained in the step 4 to low-temperature calcination in a nitrogen-oxygen mixture or air atmosphere, to give a nitrogen-containing luminescent particle product.

A luminescent device according to the present invention is characterized by at least comprising an LED chip emitting UV light, violet light or blue light, and a fluorescent powder, wherein the fluorescent powder at least uses the nitrogen-containing luminescent particle of the present invention.

A luminescent device according to the present invention is characterized by at least comprising an LED chip emitting UV light, violet light or blue light, and a fluorescent powder, wherein the fluorescent powder at least uses the nitrogen-containing illuminant of the present invention.

The present invention is achieved based on the principles that: through the structural design of the nitrogen-containing luminescent particle as described above, the structure of the nitrogen-containing luminescent particle is divided into the oxygen poor zone, the transition zone, and the oxygen rich zone, and these zones are integrally chemically bonded together. Maintaining the original atom composition of the mix in the oxygen poor zone facilitates nucleation of the luminescent crystal of the nitride luminescent particle, thereby ensuring highly efficient luminescence; because a suitable amount of oxygen is present in the nitroxide material of the transition zone and in the oxide material of the oxygen rich zone in the nitrogen-containing luminescent particle, and particularly, the oxygen content is increasing from the core to the outer surface of the particle in the structure of the nitrogen-containing luminescent particle, the negative effect on the highly efficient luminescence formed in the transition zone and the oxygen rich zone can be effectively reduced, thereby ensuring significant improvement of luminescent efficiency of the whole particle; compared to nitrogen ion, oxygen ion has a smaller radius, higher electro-negativity, and stronger interionic binding force, and with the increase of oxygen content from the core to the outer surface of the particle in the structure of the nitrogen-containing luminescent particle, chemical and thermal stabilities of the transition zone and the oxygen rich zone in the nitrogen-containing luminescent particle can be gradually increased, so as to provide effective protection and shielding effect on the oxygen poor zone of the luminescent particle, thereby effectively improving thermal stability and durability of the nitrogen-containing luminescent particle in the LED application environment.

Compared with the prior art, the present invention has the following significant advantages.

1. Good chemical stability. In the present invention, a suitable amount of oxygen is introduced respectively in the transition zone and the oxygen rich zone of the nitrogen-containing luminescent particle, which meets the demands of growth of the host crystal of the nitrogen-containing luminescent particle in the process from nucleation to forming and densification, making the crystal structure more compact and stable, and thus improving weatherability of the nitrogen-containing luminescent particle.

2. Good aging and light decay resistance. In the present invention, the structure of the nitrogen-containing luminescent particle is divided into the oxygen poor zone, the transition zone, and the oxygen rich zone, and the oxygen content is increasing from the core to the outer surface of the particle in the structure of the nitrogen-containing luminescent particle, such that oxygen ion having a smaller radius than that of nitrogen ion can be substituted for more nitrogen ions, so as to enhance the interionic binding force in the structure of the nitrogen-containing luminescent particle, thereby imparting the luminescent particle with very excellent aging and light decay resistance and thus high-temperature durability. In addition, because of the barrier protection effect from the transition zone and the oxygen rich zone, the oxygen poor zone of the nitrogen-containing luminescent particle is less susceptible to the external adverse environment, such that stability of the luminescent center of the nitrogen-containing luminescent particle is significantly improved.

3. High luminescent efficiency. In the present invention, maintaining the original atom composition of the mix in the oxygen poor zone facilitates nucleation of the luminescent crystal of the nitride luminescent particle, thereby ensuring highly efficient luminescence; because a suitable amount of oxygen is present in the nitroxide material of the transition zone and in the oxide material of the oxygen rich zone in the nitrogen-containing luminescent particle, and particularly, the oxygen content is increasing from the core to the outer surface of the particle in the structure of the nitrogen-containing luminescent particle, the negative effect on the highly efficient luminescence formed in the transition zone and the oxygen rich zone can be effectively reduced, thereby ensuring significant improvement of luminescent efficiency of the whole particle.

4. Wide applicability. The nitrogen-containing luminescent particle of the present invention is suitable for both nitrogen-containing illuminants and various luminescent devices.

5. Ease and reliability of the manufacturing method. The manufacturing method of the present invention is advantageous for improving chemical and physical stabilities of the nitrogen-containing luminescent particle and the nitrogen-containing illuminant, and useful for industrial mass production.

DETAILED DESCRIPTION OF THE INVENTION

A detailed description of the present invention will be further given below in detail with reference to the accompanying drawings and embodiments.

Figure 1:
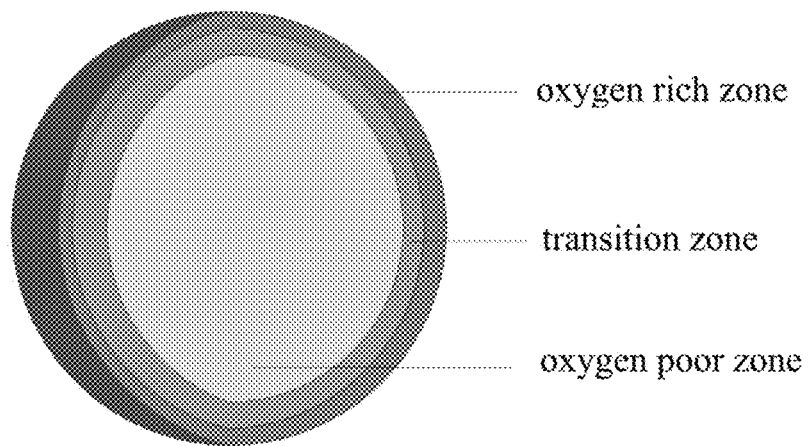
FIG. 1 is a cross-sectional diagram of a structure of a nitrogen-containing luminescent particle of the present invention.

Referring to FIG. 1, a nitrogen-containing luminescent particle of the present invention is shown. A structure of the nitrogen-containing luminescent particle is divided into an oxygen poor zone, a transition zone, and an oxygen rich zone from a core to an outer surface of the particle depending on an increasing oxygen content, the oxygen poor zone being predominantly a nitride luminescent crystal or oxygen-containing solid solution thereof, the transition zone being predominantly a nitroxide material, the oxygen rich zone being predominantly an oxide material or oxynitride material; the nitride luminescent crystal or oxygen-containing solid solution thereof has a chemical formula of $M_{m-m1}A_{a1}B_{b1}O_{o1}N_{n1}:R_{m1}$, the nitroxide material has a chemical formula of $M_{m-m2}A_{a2}B_{b2}O_{o2}N_{n2}:R_{m2}$, the oxide material or oxynitride material has a chemical formula of $M_{m-m3}A_{a3}B_{b3}O_{o3}N_{n3}:R_{m3}$; in the chemical formulas, the M element is at least one of Mg, Ca, Sr, Ba, Zn, Li, Na, K, Y, and Sc, the A element is at least one of B, Al, Ga, and In, the B element is at least one of C, Si, Ge, and Sn, R is at least one of Ce, Pr, Nd, Sm, Eu, Gd, Tb, Dy, Ho, Er, Tm, Yb, and Lu, wherein $0.5 \leq m \leq 1.5$, $0.001 \leq m1 \leq 0.2$, $0.5 \leq a1 \leq 1.5$, $0.5 \leq b1 \leq 1.5$, $0 \leq o1 \leq 0.5$, $2.5 \leq n1 \leq 3.5$, $0 \leq m2 \leq 0.2$, $0.5 \leq a2 \leq 1.5$, $0.5 \leq b2 \leq 1.5$, $0.1 \leq o2 \leq 4$, $0.1 \leq n2 \leq 3$, $0 \leq m3 \leq 0.2$, $0.5 \leq a3 \leq 1.5$, $0.5 \leq b3 \leq 1.5$, $3 \leq o3 \leq 5$, $0 \leq n3 \leq 0.5$.

Further preferred embodiments of a nitrogen-containing luminescent particle of the present invention include the following.

The transition zone has a thickness ranging from 50-500 nm, the oxygen rich zone is at the outer side of the transition zone and has a thickness of no more than 50 nm, and the oxygen poor zone is from the inner side of the transition zone to the core of the nitrogen-containing luminescent particle.

The nitride luminescent crystal or oxygen-containing solid solution thereof in the oxygen poor zone has a content of no less than 90%, the nitroxide material in the transition zone has a content of no less than 60%, and the oxide material or oxynitride material in the oxygen rich zone has a content of no less than 50%.

The nitride luminescent crystal is at least one of $(Sr_xCa_{1-x-y1})AlSiN_3$:y1Eu or an oxygen-containing solid solution thereof, the nitroxide material is $(Sr_xCa_{1-x-y1})AlSiN_{3-z1}O_{1.5z1}$:y1Eu, and the oxide material or oxynitride material is $(Sr_xCa_{1-x-y1})AlSiO_{4.5-z2}N_{z2}$:y1Eu, wherein $0 \leq x \leq 0.99$, $0.001 \leq y1 \leq 0.2$, $0 \leq z1 \leq 3$, $0 \leq z2 \leq 0.5$.

The oxygen poor zone further comprises a nitroxide luminescent crystal, the transition zone further comprises a nitride material, and the oxygen rich zone further comprises a nitroxide material.

Any of the nitrogen-containing luminescent particles of the present invention as described above is excited at an excitation wavelength ranging from 300-500 nm to emit red light having a peak wavelength at 600-670 nm.

A nitrogen-containing illuminant according to the present invention comprises a mixture of any of the nitrogen-containing luminescent particles of the present invention as described above and other crystalline grains or non-crystalline particles, the nitrogen-containing luminescent particle being present in the mixture at a proportion of no less than 50 wt %.

A method 1 for preparing a nitrogen-containing luminescent particle and preferred embodiments thereof according to the present invention comprises the following specific steps:

step 1: weighting desired starting materials at a stoichiometric ratio of cations in the composition of a chemical formula $M_{m-m1}A_{a1}B_{b1}O_{o1}N_{n1}$:$R_{m1}$, with a nitride, oxide or halide of M, A, B, and R as starting materials;

step 2: uniformly mixing the starting materials weighted in the step 1 in a nitrogen atmosphere to form a mix;

step 3: subjecting the mix obtained in the step 2 to high-temperature calcination in a calcination atmosphere, followed by low-temperature calcination at a reduced predetermined temperature in a nitrogen-oxygen mixture or air atmosphere, to give a nitrogen-containing luminescent particle semi-product;

wherein the high-temperature calcination has a temperature of 1400-2000° C. and a duration of 6-18 h; the atmosphere of the high-temperature calcination is a nitrogen atmosphere, a nitrogen-argon mixture atmosphere, another inert gas atmosphere, a nitrogen-hydrogen mixture atmosphere, or another reducing gas atmosphere; the pressure of the high-temperature calcination is 1-100 atm; the low-temperature calcination has a temperature of 200-450° C. and a duration of 1-24 h; the feeding rate of the nitrogen-oxygen mixture or air in the low-temperature calcination is 0.1-10 L/min; and the volume percent of oxygen in the nitrogen-oxygen mixture atmosphere is no more than 20%; and step 4: subjecting the nitrogen-containing luminescent particle semi-product obtained in the step 3 to a post-treatment, to give a nitrogen-containing luminescent particle product; wherein the post-treatment includes grinding, screening, washing, drying, and the washing is performed to obtain the nitrogen-containing luminescent particle product having a conductivity of less than 10 μs/cm.

A method 2 for preparing a nitrogen-containing luminescent particle and preferred embodiments thereof according to the present invention comprises the following specific steps:

step 1: weighting desired starting materials at a stoichiometric ratio of cations in the composition of a chemical formula $M_{m-m1}A_{a1}B_{b1}O_{o1}N_{n1}$:$R_{m1}$, with a nitride, oxide or halide of M, A, B, and R as starting materials;

step 2: uniformly mixing the starting materials weighted in the step 1 in a nitrogen atmosphere to form a mix;

step 3: subjecting the mix obtained in the step 2 to high-temperature calcination in a calcination atmosphere, to give a nitrogen-containing luminescent particle semi-product;

wherein the high-temperature calcination has a temperature of 1400-2000° C. and a duration of 6-18 h; the atmosphere of the high-temperature calcination is a nitrogen atmosphere, a nitrogen-argon mixture atmosphere, another inert gas atmosphere, a nitrogen-hydrogen mixture atmosphere, or another reducing gas atmosphere; and the pressure of the high-temperature calcination is 1-100 atm;

step 4: subjecting the nitrogen-containing luminescent particle semi-product obtained in the step 3 to a post-treatment; wherein the post-treatment includes grinding, screening, washing, drying, and the washing is performed to obtain the nitrogen-containing luminescent particle product having a conductivity of less than 10 μs/cm; and step 5: subjecting the nitrogen-containing luminescent particle obtained in the step 4 to low-temperature calcination in a nitrogen-oxygen mixture or air atmosphere, to give a nitrogen-containing luminescent particle product; wherein the low-temperature calcination has a temperature of 200-450° C. and a duration of 1-24 h; and the volume percent of oxygen in the nitrogen-oxygen mixture atmosphere is no more than 20%.

A luminescent device according to the present invention at least comprises an LED chip emitting UV light, violet light or blue light, and a fluorescent powder, wherein the fluorescent powder at least uses any of the nitrogen-containing luminescent particles of the present invention as described above.

A luminescent device according to the present invention at least comprises an LED chip emitting UV light, violet light or blue light, and a fluorescent powder, wherein the fluorescent powder at least uses the nitrogen-containing illuminant of the present invention as described above.

Further preferably, a luminescent device according to the present invention further comprises other types of fluorescent powders, so as to meet lighting requirements or applications in high-color-rendering white light LEDs in the backlight, by complementation of luminescent colors.

Specific examples and comparative examples of a nitrogen-containing luminescent particle and method for preparing a same according to the present invention are further disclosed below, wherein the examples means that a nitrogen-containing luminescent particle product is obtained following a structure of a nitrogen-containing luminescent particle and method for preparing a same of the present invention, and the comparative examples means that a nitrogen-containing luminescent particle product is obtained following a nitrogen-containing luminescent particle and method for preparing a same disclosed in the prior art. The average oxygen atom content and the average nitrogen atom content in the nitrogen-containing luminescent particles are obtained by an oxygen/nitrogen analyzer.

Example 1

Figure 2:
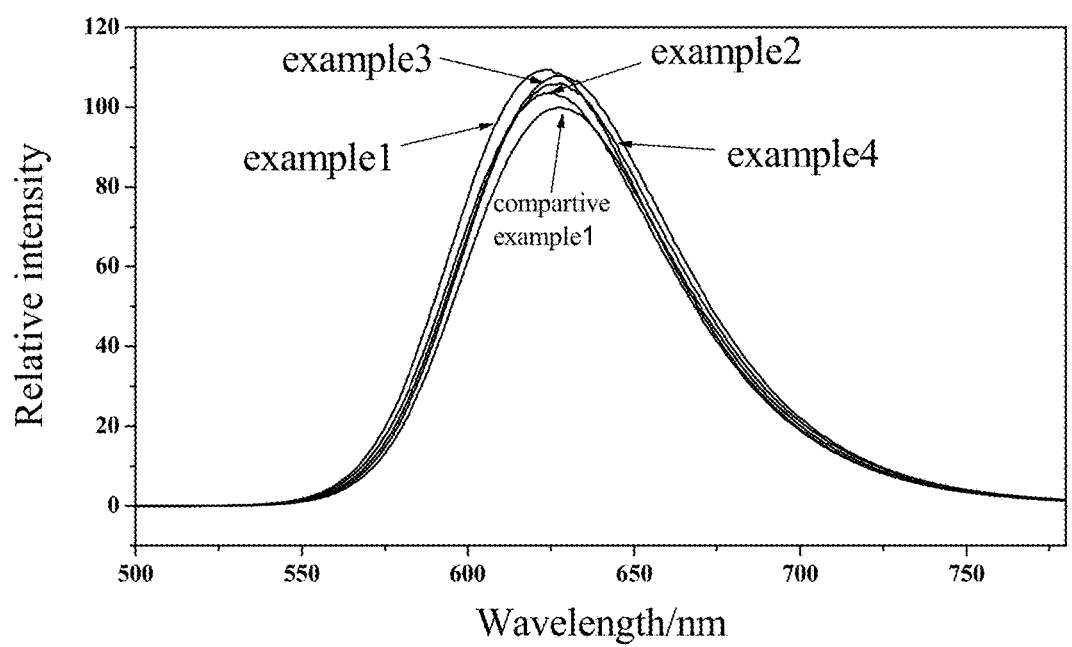
FIG. 2 is emission spectra of nitrogen-containing luminescent particles from examples 1-4 and a comparative example 1 of the present invention.
Figure 3:
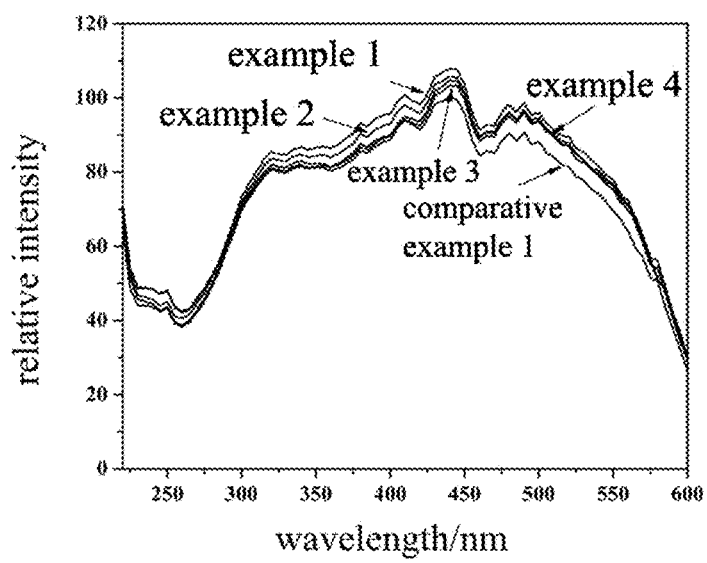
FIG. 3 is excitation spectra of the nitrogen-containing luminescent particles from the examples 1-4 and the comparative example 1 of the present invention.
Figure 4:
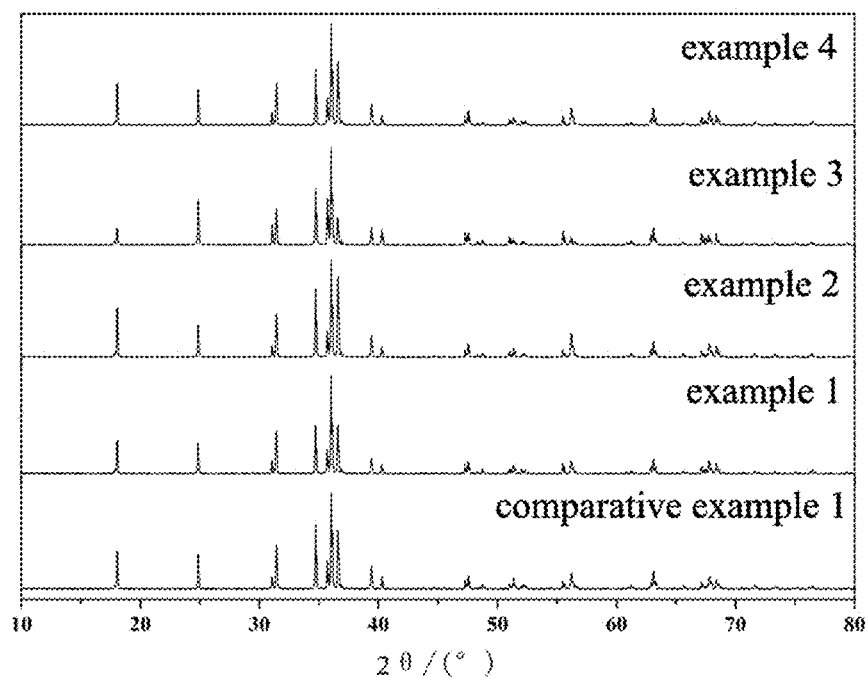
FIG. 4 is X-ray diffraction patterns of the nitrogen-containing luminescent particles from the examples 1-4 and the comparative example 1 of the present invention.

0.27 g of $Ca_3N_2$, 9.954 g of $Sr_3N_2$, 4.477 g of AlN, 5.107 g of $Si_3N_4$, and 0.192 g of $Eu_2O_3$ were weighted. These starting materials were thoroughly mixed in a nitrogen atmosphere for 3 h and charged into an Mo crucible, which was rapidly transferred to a tubular furnace, and then the temperature was gradually raised to 1700° C. under a nitrogen atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 8.56 μs/cm, and after drying, the temperature was raised to 400° C. in an air atmosphere for calcination for 5 h, to give a nitrogen-containing luminescent particle product. The emission spectrum is shown in FIG. 2, the excitation spectrum is shown in FIG. 3, and the X-ray diffraction pattern is shown in FIG. 4. The chemical composition of the oxygen poor zone of the nitrogen-containing luminescent particle is $Ca_{0.05}Sr_{0.94}AlSiN_3:0.01Eu$, the chemical composition of the transition zone is $Ca_{0.05}Sr_{0.94}AlSiO_{1.5}N_2:0.01Eu$, with a thickness of 400 nm, and the chemical composition of the oxygen rich zone is $Ca_{0.05}Sr_{0.94}AlSiO_{4.5}:0.01Eu$, with a thickness of 30 nm.

Example 2

0.435 g of $Ca_3N_2$, 9.712 g of $Sr_3N_2$, 4.512 g of AlN, 5.147 g of $Si_3N_4$, and 0.194 g of $Eu_2O_3$ were weighted. These starting materials were thoroughly mixed in a nitrogen atmosphere for 3 h and charged into an Mo crucible, which was rapidly transferred to a tubular furnace, and then the temperature was gradually raised to 1700° C. under a nitrogen atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 4.42 μs/cm, and after drying, the temperature was raised to 400° C. in an air atmosphere for calcination for 5 h, to give a nitrogen-containing luminescent particle product. The emission spectrum is shown in FIG. 2, the excitation spectrum is shown in FIG. 3, and the X-ray diffraction pattern is shown in FIG. 4. The chemical composition of the oxygen poor zone of the nitrogen-containing luminescent particle is $Ca_{0.08}Sr_{0.91}AlSiN_3:0.01Eu$, the chemical composition of the transition zone is $Ca_{0.08}Sr_{0.91}AlSiO_{1.5}N_{1.8}:0.01Eu$, with a thickness of 380 nm, and the chemical composition of the oxygen rich zone is $Ca_{0.08}Sr_{0.91}AlSi_{0.7}O_{3.9}:0.01Eu$, with a thickness of 25 nm.

Example 3

0.547 g of $Ca_3N_2$, 9.549 g of $Sr_3N_2$, 4.535 g of AlN, 5.174 g of $Si_3N_4$, and 0.195 g of $Eu_2O_3$ were weighted. These starting materials were thoroughly mixed in a nitrogen atmosphere for 3 h and charged into an Mo crucible, which was rapidly transferred to a tubular furnace, and then the temperature was gradually raised to 1700° C. under a nitrogen atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 6.25 μs/cm, and after drying, the temperature was raised to 400° C. in an air atmosphere for calcination for 5 h, to give a nitrogen-containing luminescent particle product. The emission spectrum is shown in FIG. 2, the excitation spectrum is shown in FIG. 3, and the X-ray diffraction pattern is shown in FIG. 4. The chemical composition of the oxygen poor zone of the nitrogen-containing luminescent particle is $Ca_{0.1}Sr_{0.89}AlSiN_3:0.01Eu$, the chemical composition of the transition zone is $Ca_{0.1}Sr_{0.89}AlSiO_{1.5}N_2:0.01Eu$, with a thickness of 270 nm, and the chemical composition of the oxygen rich zone is $Ca_{0.1}Sr_{0.89}AlSiO_{4.4}:0.01Eu$, with a thickness of 42 nm.

Example 4

Figure 5:
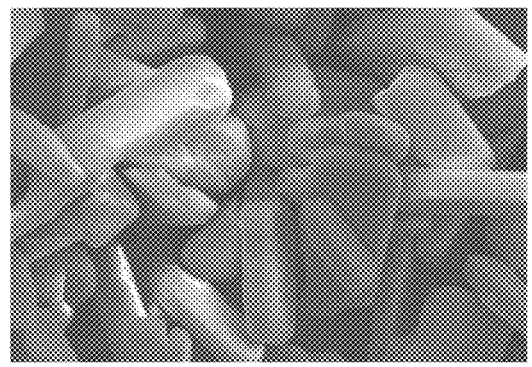
FIG. 5 is an SEM picture of the nitrogen-containing luminescent particle from the example 4 of the present invention.

0.66 g of $Ca_3N_2$, 9.383 g of $Sr_3N_2$, 5.56 g of AlN, 5.202 g of $Si_3N_4$, and 0.196 g of $Eu_2O_3$ were weighted. These starting materials were thoroughly mixed in a nitrogen atmosphere for 3 h and charged into an Mo crucible, which was rapidly transferred to a tubular furnace, and then the temperature was gradually raised to 1700° C. under a nitrogen atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 7.28 μs/cm, and after drying, the temperature was raised to 400° C. in an air atmosphere for calcination for 5 h, to give a nitrogen-containing luminescent particle product. The emission spectrum is shown in FIG. 2, the excitation spectrum is shown in FIG. 3, the luminescent intensity is shown in Table 1 and is higher than that in comparative example 1, the X-ray diffraction pattern is shown in FIG. 4, and the SEM picture is shown in FIG. 5. The chemical composition of the oxygen poor zone of the nitrogen-containing luminescent particle is $Ca_{0.12}Sr_{0.87}AlSiN_3:0.01Eu$, the chemical composition of the transition zone is $Ca_{0.12}Sr_{0.87}AlSiO_{1.35}N_{2.1}:0.01Eu$, with a thickness of 360 nm, and the chemical composition of the oxygen rich zone is $Ca_{0.12}Sr_{0.87}AlSi_{1.05}O_{4.3}N_{0.2}:0.01Eu$, with a thickness of 48 nm.

Comparative Example 1

Figure 6:
FIG. 6 is an SEM picture of the nitrogen-containing luminescent particle from the comparative example 1 of the present invention.

0.66 g of $Ca_3N_2$, 9.383 g of $Sr_3N_2$, 5.56 g of AlN, 5.202 g of $Si_3N_4$, and 0.196 g of $Eu_2O_3$ were weighted. These starting materials were thoroughly mixed in a nitrogen atmosphere for 3 h and charged into an Mo crucible, which was rapidly transferred to a tubular furnace, and then the temperature was gradually raised to 1700° C. under a nitrogen atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 5.12 μs/cm, and after drying, a nitrogen-containing luminescent particle product was obtained. The emission spectrum is shown in FIG. 2, the excitation spectrum is shown in FIG. 3, the X-ray diffraction pattern is shown in FIG. 4, and the SEM picture is shown in FIG. 6. The chemical composition of the nitrogen-containing luminescent particle is $Ca_{0.12}Sr_{0.87}AlSiN_3:0.01Eu$.

The nitrogen-containing luminescent particles in the examples and the comparative example as described above were made into a luminescent device respectively, and the testing results show that the luminescent intensity and the aging properties of the comparative example 1 are lower than those of the examples 1-4, as shown in Table 1. The aging conditions are: SMD 2835 LED Lamp Bead, chip size 10×30 mil, chip band 452.5-455 nm, current 150 mA, power 0.5 W, ambient conditions: normal temperature and moisture.

TABLE 1

| | luminescent intensity | 1000 h aging | | |
| --- | --- | --- | --- | --- |
| | | light decay | ΔX | ΔY |
| Example 1 | 105 | 2.2% | −0.006 | 0.005 |
| Example 2 | 103 | 2.3% | −0.007 | 0.005 |

TABLE 1-continued

|  | luminescent intensity | 1000 h aging | | |
| --- | --- | --- | --- | --- |
|  |  | light decay | ΔX | ΔY |
| Example 3 | 103 | 2.3% | −0.007 | 0.006 |
| Example 4 | 104 | 2.5% | −0.01 | 0.008 |
| Comparative example 1 | 100 | 4.1% | −0.022 | 0.015 |

Example 5

0.545 g of $Ca_3N_2$, 9.412 g of $Sr_3N_2$, 4.522 g of AlN, 5.133 g of $Si_3N_4$, and 0.388 g of $Eu_2O_3$ were weighted. These starting materials were thoroughly mixed in a nitrogen atmosphere for 2 h and charged into an Mo crucible, which was rapidly transferred to a tubular furnace, and then the temperature was gradually raised to 1800° C. under a nitrogen-argon mixture atmosphere for 10 h, and then the temperature was reduced to 350° C., and the air atmosphere was fed at a rate of 5 L/min for calcination for 6 h; the resulting nitrogen-containing luminescent particle was pulverized and sieved, the sieved nitrogen-containing luminescent particle was placed into deionized water and stirred for 30 min, then suction-filtered, and finally washed to a conductivity of 5.33 μs/cm, and after drying, a nitrogen-containing luminescent particle product was obtained. The chemical composition of the oxygen poor zone of the nitrogen-containing luminescent particle is $Ca_{0.1}Sr_{0.88}AlSi_{0.995}O_{0.02}O_2N_{2.98}$:0.02Eu, the chemical composition of the transition zone is $Ca_{0.1}Sr_{0.88}AlSiO_{0.9}N_{2.4}$:0.02Eu, with a thickness of 450 nm, and the chemical composition of the oxygen rich zone is $Ca_{0.1}Sr_{0.88}AlSiO_{4.5}$:0.02Eu, with a thickness of 24 nm.

Example 6

0.447 g of $Ca_3N_2$, 11.3 g of $Ba_3N_2$, 3.706 g of AlN, 4.229 g of $Si_3N_4$, and 0.318 g of $Eu_2O_3$ were weighted. These starting materials were thoroughly mixed in a nitrogen atmosphere for 2 h and charged into an Mo crucible, which was rapidly transferred to a tubular furnace, and then the temperature was gradually raised to 1800° C. under a nitrogen-argon mixture atmosphere for 10 h, and then the temperature was reduced to 350° C., and the air atmosphere was fed at a rate of 5 L/min for calcination for 6 h; the resulting nitrogen-containing luminescent particle was pulverized and sieved, the sieved nitrogen-containing luminescent particle was placed into deionized water and stirred for 30 min, then suction-filtered, and finally washed to a conductivity of 6.89 μs/cm, and after drying, a nitrogen-containing luminescent particle product was obtained. The chemical composition of the oxygen poor zone of the nitrogen-containing luminescent particle is $Ca_{0.1}Ba_{0.88}AlSiN_3$:0.02Eu, the chemical composition of the transition zone is $Ca_{0.1}Ba_{0.88}AlSiO_{0.9}N_{2.4}$:0.02Eu, with a thickness of 200 nm, and the chemical composition of the oxygen rich zone is $Ca_{0.1}Ba_{0.88}AlSi_{1.01}O_{4.5}$, with a thickness of 32 nm.

Example 7

0.547 g of $Ca_3N_2$, 9.442 g of $Sr_3N_2$, 4.309 g of AlN, 0.137 g of BN, 5.175 g of $Si_3N_4$, and 0.389 g of $Eu_2O_3$ were weighted. These starting materials were thoroughly mixed in a nitrogen atmosphere for 2 h and charged into an Mo crucible, which was rapidly transferred to a tubular furnace, and then the temperature was gradually raised to 1800° C. under a nitrogen-argon mixture atmosphere for 10 h, and then the temperature was reduced to 350° C., and the air atmosphere was fed at a rate of 5 L/min for calcination for 6 h; the resulting nitrogen-containing luminescent particle was pulverized and sieved, the sieved nitrogen-containing luminescent particle was placed into deionized water and stirred for 30 min, then suction-filtered, and finally washed to a conductivity of 7.65 μs/cm, and after drying, a nitrogen-containing luminescent particle product was obtained. The chemical composition of the oxygen poor zone of the nitrogen-containing luminescent particle is $Ca_{0.1}Sr_{0.88}Al_{0.95}B_{0.05}SiN_3$:0.02Eu, the chemical composition of the transition zone is $Ca_{0.1}Sr_{0.88}Al_{0.95}B_{0.05}SiO_{1.2}N_{2.2}$:0.02Eu, with a thickness of 360 nm, and the chemical composition of the oxygen rich zone is $Ca_{0.2}Sr_{0.78}AlSiO_{4.5}$:0.02Eu, with a thickness of 50 nm.

Example 8

0.538 g of $Ca_3N_2$, 9.291 g of $Sr_3N_2$, 4.24 g of AlN, 0.456 g of GaN, 5.092 g of $Si_3N_4$, and 0.383 g of $Eu_2O_3$ were weighted. These starting materials were thoroughly mixed in a nitrogen atmosphere for 2 h and charged into an Mo crucible, which was rapidly transferred to a tubular furnace, and then the temperature was gradually raised to 1800° C. under a nitrogen-argon mixture atmosphere for 10 h, and then the temperature was reduced to 350° C., and the air atmosphere was fed at a rate of 5 L/min for calcination for 6 h; the resulting nitrogen-containing luminescent particle was pulverized and sieved, the sieved nitrogen-containing luminescent particle was placed into deionized water and stirred for 30 min, then suction-filtered, and finally washed to a conductivity of 7.65 μs/cm, and after drying, a nitrogen-containing luminescent particle product was obtained. The chemical composition of the oxygen poor zone of the nitrogen-containing luminescent particle is $Ca_{0.1}Sr_{0.88}Al_{0.95}Ga_{0.05}SiN_3$:0.02Eu, the chemical composition of the transition zone is $Ca_{0.1}Sr_{0.88}Al_{0.95}Ga_{0.05}SiO_{1.5}N_2$:0.02Eu, with a thickness of 310 nm, and the chemical composition of the oxygen rich zone is $Ca_{0.1}Sr_{0.88}Al_{0.95}Ga_{0.05}Si_{0.76}O_4$, with a thickness of 50 nm.

Example 9

0.556 g of $Ca_3N_2$, 9.05 g of $Sr_3N_2$, 0.131 g of $Li_3N$, 4.609 of AlN, 5.259 g of $Si_3N_4$, and 0.396 g of $Eu_2O_3$ were weighted. These starting materials were thoroughly mixed in a nitrogen atmosphere for 2 h and charged into an Mo crucible, which was rapidly transferred to a tubular furnace, and then the temperature was gradually raised to 1800° C. under a nitrogen-argon mixture atmosphere for 10 h, and then the temperature was reduced to 350° C., and the air atmosphere was fed at a rate of 5 L/min for calcination for 6 h; the resulting nitrogen-containing luminescent particle was pulverized and sieved, the sieved nitrogen-containing luminescent particle was placed into deionized water and stirred for 30 min, then suction-filtered, and finally washed to a conductivity of 9.12 μs/cm, and after drying, a nitrogen-containing luminescent particle product was obtained. The chemical composition of the oxygen poor zone of the nitrogen-containing luminescent particle is $Ca_{0.1}Sr_{0.83}Li_{0.1}AlSiN_3$:0.02Eu, the chemical composition of the transition zone is $Ca_{0.1}Sr_{0.83}Li_{0.1}AlSi_{0.7}O_{1.2}N_{1.8}$:0.02Eu, with a thickness of 440 nm, and the chemical composition of the oxygen rich zone is $Ca_{0.1}Sr_{0.83}Li_{0.1}AlSi_{0.7}O_{3.88}$, with a thickness of 25 nm.

Comparative Example 2

0.544 g of $Ca_3N_2$, 9.4 g of $Sr_3N_2$, 4.516 g of AlN, 5.152 g of $Si_3N_4$, and 0.388 g of $Eu_2O_3$ were weighted. These starting materials were thoroughly mixed in a nitrogen atmosphere for 2 h and charged into an Mo crucible, which was rapidly transferred to a tubular furnace, and then the temperature was gradually raised to 1800° C. under a nitrogen-argon mixture atmosphere for 10 h; the resulting nitrogen-containing luminescent particle was pulverized and sieved, the sieved nitrogen-containing luminescent particle was placed into deionized water and stirred for 30 min, then suction-filtered, and finally washed to a conductivity of 5.77 μs/cm, to give a nitrogen-containing luminescent particle product. The chemical composition of the nitrogen-containing luminescent particle is $Ca_{0.1}Sr_{0.88}AlSiN_3:0.02Eu$.

The nitrogen-containing luminescent particles in the examples and the comparative example as described above were made into a luminescent device respectively, and the testing results show that the luminescent intensity and the aging properties of the comparative example 2 are lower than those of the examples 5-9, as shown in Table 2. The aging conditions are: SMD 2835 LED Lamp Bead, chip size 10×30 mil, chip band 452.5-455 nm, current 150 mA, power 0.5 W, ambient conditions: normal temperature and moisture.

TABLE 2

| | luminescent intensity | 1000 h aging | | |
|---|---|---|---|---|
| | | light decay | ΔX | ΔY |
| Example 5 | 105 | 2.5% | −0.008 | 0.006 |
| Example 6 | 104 | 2.6% | −0.009 | 0.008 |
| Example 7 | 105 | 2.7% | −0.01 | 0.009 |
| Example 8 | 103 | 2.6% | −0.01 | −0.01 |
| Example 9 | 105 | 2.6% | −0.009 | −0.009 |
| comparative example 2 | 100 | 4.3% | −0.021 | 0.015 |

Example 10

Figure 8:
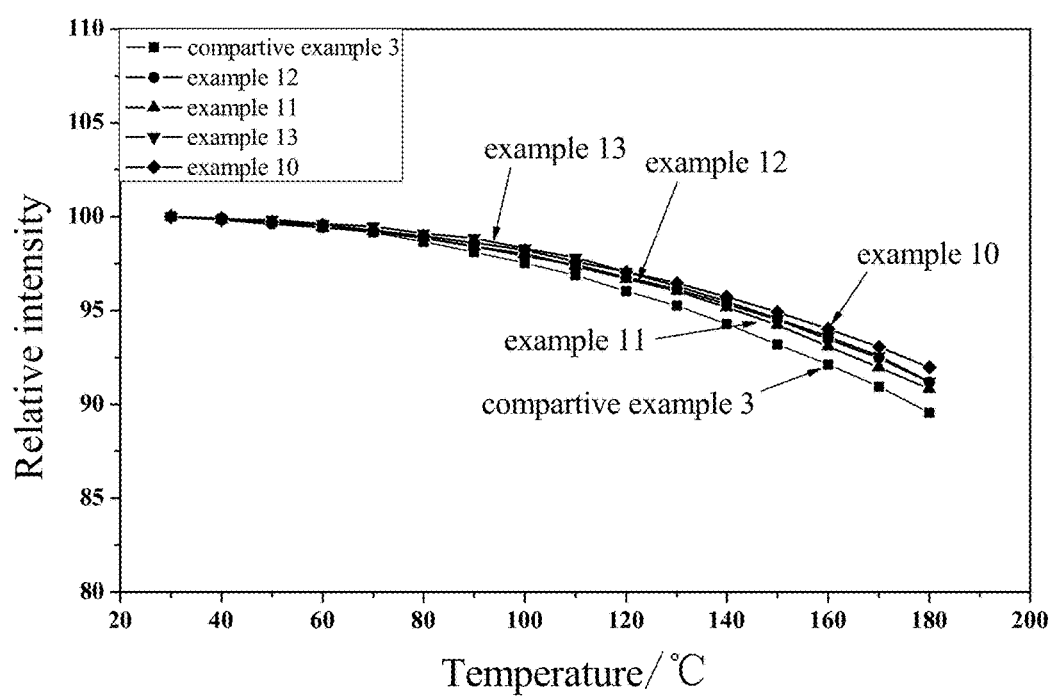
FIG. 8 is thermal quenching spectra of the nitrogen-containing luminescent particles from the examples 10-13 and the comparative example 3 of the present invention.

5.38 g of $Ca_3N_2$, 5.25 g of AlN, 5.989 g of $Si_3N_4$, and 3.381 g of $Eu_2O_3$ were weighted. These starting materials were thoroughly mixed in a nitrogen atmosphere for 3 h and charged into an Mo crucible, which was rapidly transferred to a tubular furnace, and then the temperature was gradually raised to 1850° C. under a nitrogen-argon mixture atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 4.18 μs/cm, and after drying, the temperature was raised to 300° C. in a nitrogen-oxygen mixture atmosphere (in which the volume percent of oxygen is 10%) for calcination for 8 h, to give a nitrogen-containing luminescent particle product. The emission spectrum is shown in FIG. 1, and the thermal quenching spectrum is shown in FIG. 8. The chemical composition of the oxygen poor zone of the nitrogen-containing luminescent particle is $Ca_{0.85}AlSiN_3:0.15Eu$, the chemical composition of the transition zone is $Ca_{0.85}AlSiO_{1.5}N_2:0.15Eu$, with a thickness of 230 nm, and the chemical composition of the oxygen rich zone is $Ca_{0.85}AlSiO_{4.5}:0.15Eu$, with a thickness of 30 nm.

Example 11

5.432 g of $Ca_3N_2$, 5.301 g of AlN, 6.047 g of $Si_3N_4$, and 3.219 g of EuN were weighted. These starting materials were thoroughly mixed in a nitrogen atmosphere for 3 h and charged into an Mo crucible, which was rapidly transferred to a tubular furnace, and then the temperature was gradually raised to 1850° C. under a nitrogen-argon mixture atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 7.63 μs/cm, and after drying, the temperature was raised to 300° C. in a nitrogen-oxygen mixture atmosphere (in which the volume percent of oxygen is 10%) for calcination for 8 h, to give a nitrogen-containing luminescent particle product. The emission spectrum is shown in FIG. 1, and the thermal quenching spectrum is shown in FIG. 8. The chemical composition of the oxygen poor zone of the nitrogen-containing luminescent particle is $Ca_{0.85}AlSiN_3:0.15Eu$, the chemical composition of the transition zone is $Ca_{0.85}AlSi_{0.75}ON_2:0.15Eu$, with a thickness of 290 nm, and the chemical composition of the oxygen rich zone is $Ca_{0.85}AlSi_{0.625}O_{3.6}N_{0.1}:0.15Eu$, with a thickness of 25 nm.

Example 12

5.215 g of $Ca_3N_2$, 5.089 g of AlN, 5.805 g of $Si_3N_4$, and 3.891 g of $EuF_3$ were weighted. These starting materials were thoroughly mixed in a nitrogen atmosphere for 3 h and charged into an Mo crucible, which was rapidly transferred to a tubular furnace, and then the temperature was gradually raised to 1850° C. under a nitrogen-argon mixture atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 5.44 μs/cm, and after drying, the temperature was raised to 300° C. in a nitrogen-oxygen mixture atmosphere (in which the volume percent of oxygen is 10%) for calcination for 8 h, to give a nitrogen-containing luminescent particle product. The emission spectrum is shown in FIG. 1, and the thermal quenching spectrum is shown in FIG. 8. The chemical composition of the oxygen poor zone of the nitrogen-containing luminescent particle is $Ca_{0.85}AlSiN_3:0.15Eu$, the chemical composition of the transition zone is $Ca_{0.85}Al_{0.7}SiO_{0.9}N_{2.1}:0.15Eu$, with a thickness of 275 nm, and the chemical composition of the oxygen rich zone is $Ca_{0.85}Al_{0.8}SiO_{4.2}:0.15Eu$, with a thickness of 16 nm.

Example 13

Figure 7:
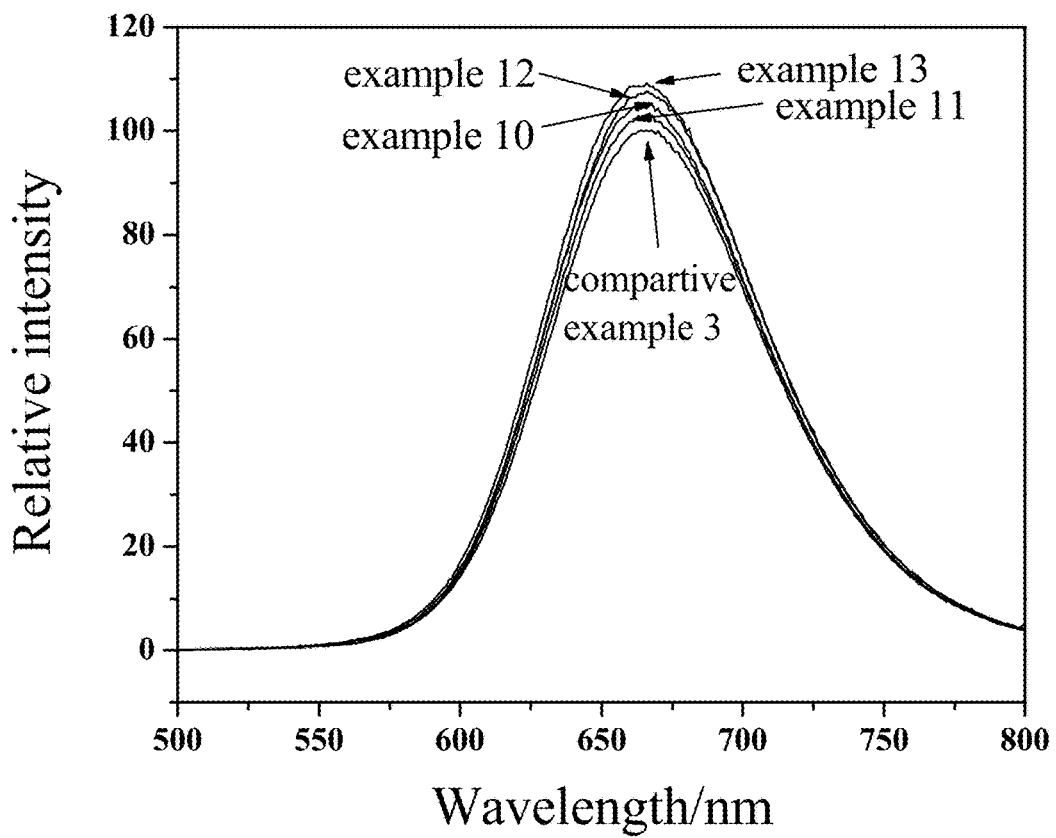
FIG. 7 is emission spectra of nitrogen-containing luminescent particles from examples 10-13 and a comparative example 3 of the present invention.

4.985 g of $Ca_3N_2$, 4.865 g of AlN, 5.55 g of $Si_3N_4$, and 4.599 g of $EuCl_3$ were weighted. These starting materials were thoroughly mixed in a nitrogen atmosphere for 3 h and charged into an Mo crucible, which was rapidly transferred to a tubular furnace, and then the temperature was gradually raised to 1850° C. under a nitrogen-argon mixture atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 6.16 μs/cm, and after drying, the temperature was raised to 300° C. in a nitrogen-oxygen mixture atmosphere (in which the volume percent of oxygen is 10%) for calcination for 8 h, to give a nitrogen-containing luminescent particle product. The emission spectrum is shown in FIG. 7, and the thermal quenching spectrum is shown in FIG. 8. The chemical composition of the oxygen poor zone of the nitrogen-containing luminescent particle is $Ca_{0.85}AlSiN_3:0.15Eu$, the chemical composition of the transition zone is $Ca_{0.85}AlSiO_{1.2}N_{2.2}:0.15Eu$, with a thickness of 365 nm, and the chemical composition of the oxygen rich zone is $Ca_{0.85}AlSiO_{4.5}:0.15Eu$, with a thickness of 42 nm.

Comparative Example 3

5.38 g of $Ca_3N_2$, 5.25 g of AlN, 5.989 g of $Si_3N_4$, and 3.381 g of $Eu_2O_3$ were weighted. These starting materials were thoroughly mixed in a nitrogen atmosphere for 3 h and charged into an Mo crucible, which was rapidly transferred to a tubular furnace, and then the temperature was gradually raised to 1850° C. under a nitrogen-argon mixture atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 6.35 μs/cm, and after drying, a nitrogen-containing luminescent particle product was obtained. The emission spectrum is shown in FIG. 7, and the thermal quenching spectrum is shown in FIG. 8. The chemical composition of the nitrogen-containing luminescent particle is $Ca_{0.85}AlSiN_3:0.15Eu$.

The nitrogen-containing luminescent particles in the examples and the comparative example as described above were made into a luminescent device respectively, and the testing results show that the luminescent intensity and the aging properties of the comparative example 3 are lower than those of the examples 10-13, as shown in Table 3. The aging conditions are: SMD 2835 LED Lamp Bead, chip size 10×30 mil, chip band 452.5-455 nm, current 150 mA, power 0.5 W, ambient conditions: normal temperature and moisture.

TABLE 3

| | luminescent intensity | 1000 h aging | | |
|---|---|---|---|---|
| | | light decay | ΔX | ΔY |
| Example 10 | 103 | 3.8% | −0.018 | 0.011 |
| Example 11 | 102 | 3.9% | −0.019 | 0.011 |
| Example 12 | 103 | 3.8% | −0.016 | 0.009 |
| Example 13 | 104 | 3.6% | −0.016 | 0.01 |
| comparative example 3 | 100 | 5.0% | −0.03 | 0.025 |

Example 14

7.191 g of $Ca_3N_2$, 6.812 g of $Si_3N_4$, 5.971 g of AlN, and 0.026 g of $Eu_2O_3$ were weighted. These starting materials were thoroughly mixed in a nitrogen atmosphere for 1 h and charged into an Mo crucible, which was rapidly transferred to a tubular furnace, and then the temperature was gradually raised to 1820° C. under a nitrogen atmosphere for 8 h; the resulting nitrogen-containing luminescent particle was pulverized and sieved, the sieved nitrogen-containing luminescent particle was placed into deionized water and stirred for 30 min, then suction-filtered, and finally washed to a conductivity of 3.27 μs/cm, and after drying, the temperature was raised to 200° C. in a nitrogen-oxygen mixture atmosphere (in which the volume percent of oxygen is 5%) for calcination for 15 h, to give a nitrogen-containing luminescent particle product. The chemical composition of the oxygen poor zone of the nitrogen-containing luminescent particle is $Ca_{0.999}AlSiN_3:0.001Eu$, the chemical composition of the transition zone is $Ca_{0.999}AlSi_{0.75}ON_2:0.001Eu$, with a thickness of 330 nm, and the chemical composition of the oxygen rich zone is $Ca_{0.999}AlSi_{0.75}O_4:0.001Eu$, with a thickness of 42 nm.

Example 15

Figure 9:
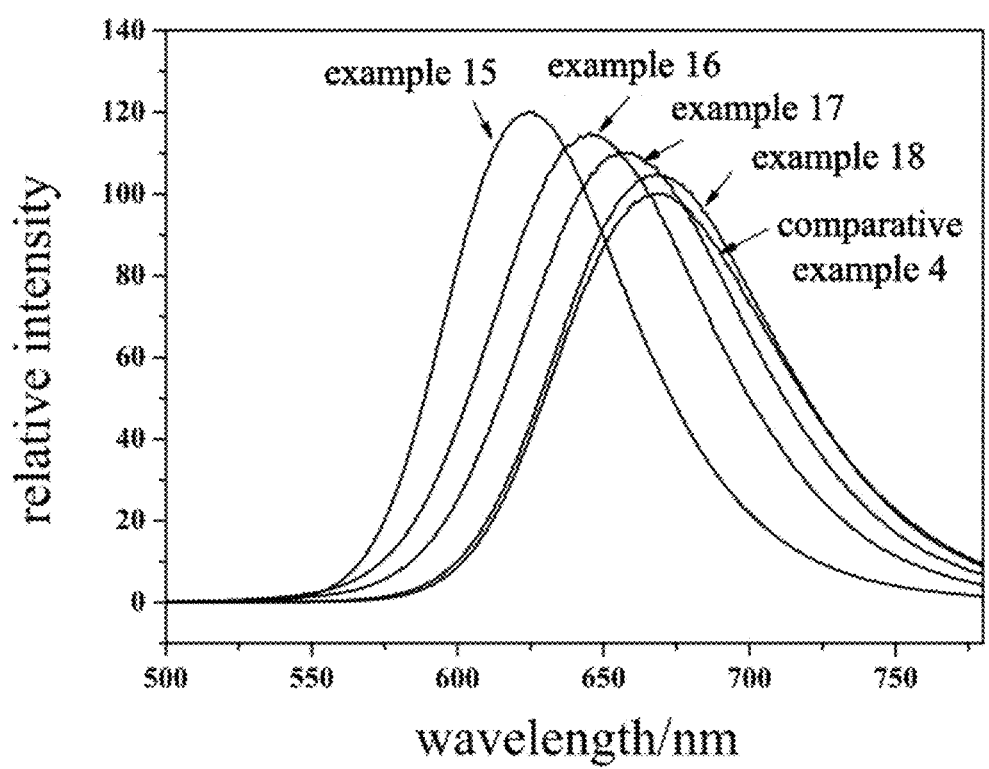
FIG. 9 is emission spectra of nitrogen-containing luminescent particles from examples 15-18 and a comparative example 4 of the present invention.

7.068 g of $Ca_3N_2$, 6.756 g of $Si_3N_4$, 5.922 g of AlN, and 0.254 g of $Eu_2O_3$ were weighted. These starting materials were thoroughly mixed in a nitrogen atmosphere for 1 h and charged into an Mo crucible, which was rapidly transferred to a tubular furnace, and then the temperature was gradually raised to 1820° C. under a nitrogen atmosphere for 8 h; the resulting nitrogen-containing luminescent particle was pulverized and sieved, the sieved nitrogen-containing luminescent particle was placed into deionized water and stirred for 30 min, then suction-filtered, and finally washed to a conductivity of 5.61 μs/cm, and after drying, the temperature was raised to 200° C. in a nitrogen-oxygen mixture atmosphere (in which the volume percent of oxygen is 5%) for calcination for 15 h, to give a nitrogen-containing luminescent particle product. The emission spectrum is shown in FIG. 9. The chemical composition of the oxygen poor zone of the nitrogen-containing luminescent particle is $Ca_{0.99}AlSiN_3:0.01Eu$, the chemical composition of the transition zone is $Ca_{0.99}AlSiO_{1.2}N_{2.2}:0.01Eu$, with a thickness of 385 nm, and the chemical composition of the oxygen rich zone is $Ca_{0.99}AlSiO_{4.5}:0.01Eu$, with a thickness of 32 nm.

Example 16

6.543 g of $Ca_3N_2$, 6.517 g of $Si_3N_4$, 5.713 g of AlN, and 1.226 g of $Eu_2O_3$ were weighted. These starting materials were thoroughly mixed in a nitrogen atmosphere for 1 h and charged into an Mo crucible, which was rapidly transferred to a tubular furnace, and then the temperature was gradually raised to 1820° C. under a nitrogen atmosphere for 8 h; the resulting nitrogen-containing luminescent particle was pulverized and sieved, the sieved nitrogen-containing luminescent particle was placed into deionized water and stirred for 30 min, then suction-filtered, and finally washed to a conductivity of 6.95 μs/cm, and after drying, the temperature was raised to 200° C. in a nitrogen-oxygen mixture atmosphere (in which the volume percent of oxygen is 5%) for calcination for 15 h, to give a nitrogen-containing luminescent particle product. The emission spectrum is shown in FIG. 9. The chemical composition of the oxygen poor zone of the nitrogen-containing luminescent particle is $Ca_{0.95}AlSiN_3:0.05Eu$, the chemical composition of the transition zone is $Ca_{0.95}AlSi_{0.775}O_{0.9}N_{2.1}:0.05Eu$, with a thickness of 360 nm, and the chemical composition of the oxygen rich zone is $Ca_{0.95}AlSi_{0.725}O_{3.9}$, with a thickness of 27 nm.

Example 17

5.937 g of $Ca_3N_2$, 6.242 g of $Si_3N_4$, 5.472 g of AlN, and 2.349 g of $Eu_2O_3$ were weighted. These starting materials were thoroughly mixed in a nitrogen atmosphere for 1 h and charged into an Mo crucible, which was rapidly transferred to a tubular furnace, and then the temperature was gradually raised to 1820° C. under a nitrogen atmosphere for 8 h; the resulting nitrogen-containing luminescent particle was pulverized and sieved, the sieved nitrogen-containing luminescent particle was placed into deionized water and stirred for 30 min, then suction-filtered, and finally washed to a conductivity of 5.14 μs/cm, and after drying, the temperature was raised to 200° C. in a nitrogen-oxygen mixture atmosphere (in which the volume percent of oxygen is 5%) for calcination for 15 h, to give a nitrogen-containing luminescent particle product. The emission spectrum is shown in FIG. 9. The chemical composition of the oxygen poor zone of the nitrogen-containing luminescent particle is $Ca_{0.9}AlSiN_3:0.1Eu$, the chemical composition of the transition zone is $Ca_{0.9}AlSiO_{1.5}N_2:0.1Eu$, with a thickness of 440 nm, and the chemical composition of the oxygen rich zone is $Ca_{0.9}AlSiO_{4.5}:0.1Eu$, with a thickness of 28 nm.

Example 18

4.866 g of $Ca_3N_2$, 5.756 g of $Si_3N_4$, 5.045 g of AlN, and 4.332 g of $Eu_2O_3$ were weighted. These starting materials were thoroughly mixed in a nitrogen atmosphere for 1 h and charged into an Mo crucible, which was rapidly transferred to a tubular furnace, and then the temperature was gradually raised to 1820° C. under a nitrogen atmosphere for 8 h; the resulting nitrogen-containing luminescent particle was pulverized and sieved, the sieved nitrogen-containing luminescent particle was placed into deionized water and stirred for 30 min, then suction-filtered, and finally washed to a conductivity of 8.22 μs/cm, and after drying, the temperature was raised to 200° C. in a nitrogen-oxygen mixture atmosphere (in which the volume percent of oxygen is 5%) for calcination for 15 h, to give a nitrogen-containing luminescent particle product. The emission spectrum is shown in FIG. 9. The chemical composition of the oxygen poor zone of the nitrogen-containing luminescent particle is $Ca_{0.8}AlSiN_3:0.2Eu$, the chemical composition of the transition zone is $Ca_{0.8}AlSi_{0.725}O_{1.1}N_{1.9}:0.2Eu$, with a thickness of 345 nm, and the chemical composition of the oxygen rich zone is $Ca_{0.8}AlSi_{1.075}O_{4.2}N_{0.3}:0.2Eu$, with a thickness of 40 nm.

Comparative Example 4

4.866 g of $Ca_3N_2$, 5.756 g of $Si_3N_4$, 5.045 g of AlN, and 4.332 g of $Eu_2O_3$ were weighted. These starting materials were thoroughly mixed in a nitrogen atmosphere for 1 h and charged into an Mo crucible, which was rapidly transferred to a tubular furnace, and then the temperature was gradually raised to 1820° C. under a nitrogen atmosphere for 8 h; the resulting nitrogen-containing luminescent particle was pulverized and sieved, the sieved nitrogen-containing luminescent particle was placed into deionized water and stirred for 30 min, then suction-filtered, and finally washed to a conductivity of 6.11 μs/cm, and after drying, a nitrogen-containing luminescent particle product was obtained. The emission spectrum is shown in FIG. 9. The chemical composition of the nitrogen-containing luminescent particle is $Ca_{0.8}AlSiN_3:0.2Eu$.

The nitrogen-containing luminescent particles in the examples and the comparative example as described above were made into a luminescent device respectively, and the testing results show that the luminescent intensity and the aging properties of the comparative example 4 are lower than those of the examples 14-18, as shown in Table 4. The aging conditions are: SMD 2835 LED Lamp Bead, chip size 10×30 mil, chip band 452.5-455 nm, current 150 mA, power 0.5 W, ambient conditions: normal temperature and moisture.

TABLE 4

| | luminescent intensity | 1000 h aging | | |
| --- | --- | --- | --- | --- |
| | | light decay | ΔX | ΔY |
| Example 14 | 120 | 2.1% | −0.01 | 0.008 |
| Example 15 | 128 | 2.3% | −0.01 | 0.007 |
| Example 16 | 118 | 2.9% | −0.012 | 0.01 |
| Example 17 | 110 | 3.3% | −0.015 | 0.013 |
| Example 18 | 102 | 4.0% | −0.022 | 0.016 |
| comparative example 4 | 100 | 6.5% | −0.035 | 0.025 |

Example 19

Figure 10:
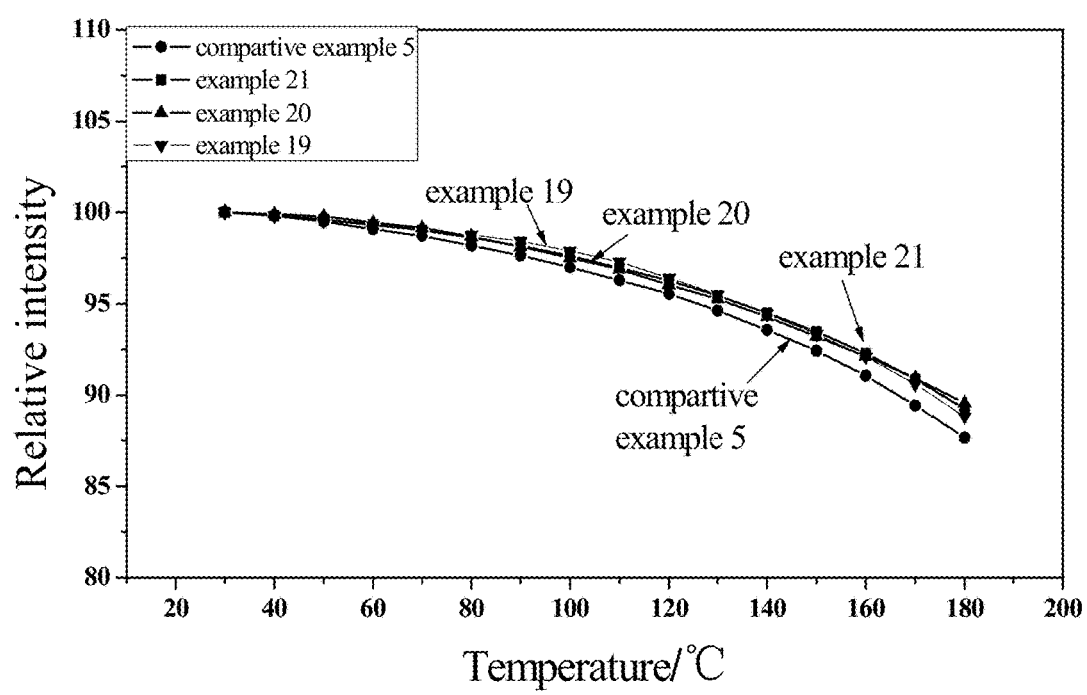
FIG. 10 is thermal quenching spectra of nitrogen-containing luminescent particles from examples 19-21 and a comparative example 5 of the present invention.

0.803 g of $Ca_3N_2$, 7.98 g of $Sr_3N_2$, 4.439 g of AlN, 5.064 g of $Si_3N_4$, and 1.715 g of $Eu_2O_3$ were weighted. These starting materials were thoroughly mixed in a nitrogen atmosphere for 4 h and charged into an Mo crucible, which was rapidly transferred to a tubular furnace, and then the temperature was gradually raised to 1780° C. under a nitrogen-argon mixture atmosphere for 9 h, and then the temperature was reduced to 320° C., and a nitrogen-oxygen mixture atmosphere (in which the volume percent of oxygen is 7%) was fed at a rate of 3 L/min for calcination for 8 h; the resulting nitrogen-containing luminescent particle was pulverized and sieved, the sieved nitrogen-containing luminescent particle was placed into deionized water and stirred for 30 min, then suction-filtered, and finally washed to a conductivity of 5.18 μs/cm, and after drying, a nitrogen-containing luminescent particle product was obtained. The thermal quenching spectrum is shown in FIG. 10. The oxygen poor zone of the nitrogen-containing luminescent particle is $Ca_{0.15}Sr_{0.76}AlSiN_3:0.09Eu$, the transition zone is $Ca_{0.15}Sr_{0.76}AlSi_{0.8}O_{0.8}N_{2.2}:0.09Eu$, with a thickness of 220 nm, and the oxygen rich zone is $Ca_{0.15}Sr_{0.76}AlSi_{0.825}O_4N_{0.1}:0.09Eu$, with a thickness of 29 nm.

Example 20

0.805 g of $Ca_3N_2$, 8.002 g of $Sr_3N_2$, 4.317 g of AlN, 0.332 g of $Al_2O_3$, 4.824 g of $Si_2N_3$, and 1.72 g of $Eu_2O_3$ were weighted. These starting materials were thoroughly mixed in a nitrogen atmosphere for 4 h and charged into an Mo crucible, which was rapidly transferred to a tubular furnace, and then the temperature was gradually raised to 1780° C. under a nitrogen-argon mixture atmosphere for 9 h, and then the temperature was reduced to 320° C., and a nitrogen-oxygen mixture atmosphere (in which the volume percent of oxygen is 7%) was fed at a rate of 3 L/min for calcination for 8 h; the resulting nitrogen-containing luminescent particle was pulverized and sieved, the sieved nitrogen-containing luminescent particle was placed into deionized water and stirred for 30 min, then suction-filtered, and finally washed to a conductivity of 6.25 μs/cm, and after drying, a nitrogen-containing luminescent particle product was obtained. The thermal quenching spectrum is shown in FIG. 10. The chemical composition of the oxygen poor zone of the nitrogen-containing luminescent particle is $Ca_{0.15}Sr_{0.76}AlSi_{0.95}O_{0.2}N_{2.8}:0.09Eu$, the chemical composition of the transition zone is $Ca_{0.15}Sr_{0.76}AlSi_{0.85}O_{0.6}N_{2.4}:0.09Eu$, with a thickness of 360 nm, and the chemical composition of the oxygen rich zone is $Ca_{0.15}Sr_{0.76}AlSi_{0.81}O_4N_{0.08}:0.09Eu$, with a thickness of 49 nm.

Example 21

0.798 g of $Ca_3N_2$, 7.932 g of $Sr_3N_2$, 4.412 g of AlN, 4.858 g of $Si_3N_4$, 0.295 g of $SiO_2$, and 1.705 g of $Eu_2O_3$ were weighted. These starting materials were thoroughly mixed in a nitrogen atmosphere for 4 h and charged into an Mo crucible, which was rapidly transferred to a tubular furnace, and then the temperature was gradually raised to 1780° C. under a nitrogen-argon mixture atmosphere for 9 h, and then the temperature was reduced to 320° C., and a nitrogen-oxygen mixture atmosphere (in which the volume percent of oxygen is 7%) was fed at a rate of 3 L/min for calcination for 8 h; the resulting nitrogen-containing luminescent particle was pulverized and sieved, the sieved nitrogen-containing luminescent particle was placed into deionized water and stirred for 30 min, then suction-filtered, and finally washed to a conductivity of 5.26 μs/cm, and after drying, a nitrogen-containing luminescent particle product was obtained. The thermal quenching spectrum is shown in FIG. 10.

The chemical composition of the oxygen poor zone of the nitrogen-containing luminescent particle is $Ca_{0.15}Sr_{0.76}AlSi_{0.975}O_{0.1}N_{2.9}$:0.09Eu, the chemical composition of the transition zone is $Ca_{0.15}Sr_{0.76}AlSi_{0.8}O_{0.8}N_{2.2}$:0.09Eu, with a thickness of 340 nm, and the chemical composition of the oxygen rich zone is $Ca_{0.15}Sr_{0.76}AlSi_{0.85}O_{4.2}$:0.09Eu, with a thickness of 29 nm.

Comparative Example 5

0.803 g of $Ca_3N_2$, 7.98 g of $Sr_3N_2$, 4.439 g of AlN, 5.064 g of $Si_3N_4$, and 1.715 g of $Eu_2O_3$ were weighted. These starting materials were thoroughly mixed in a nitrogen atmosphere for 4 h and charged into an Mo crucible, which was rapidly transferred to a tubular furnace, and then the temperature was gradually raised to 1780° C. under a nitrogen-argon mixture atmosphere for 9 h; the resulting nitrogen-containing luminescent particle was pulverized and sieved, the sieved nitrogen-containing luminescent particle was placed into deionized water and stirred for 30 min, then suction-filtered, and finally washed to a conductivity of 6.87 μs/cm, and after drying, a nitrogen-containing luminescent particle product was obtained. The thermal quenching spectrum is shown in FIG. 10. The chemical composition of the nitrogen-containing luminescent particle is $Ca_{0.15}Sr_{0.76}AlSiN_3$:0.09Eu.

The nitrogen-containing luminescent particles in the examples and the comparative example as described above were made into a luminescent device respectively, and the testing results show that the luminescent intensity and the aging properties of the comparative example 5 are lower than those of the examples 19-21, as shown in Table 5. The aging conditions are: SMD 2835 LED Lamp Bead, chip size 10×30 mil, chip band 452.5-455 nm, current 150 mA, power 0.5 W, ambient conditions: normal temperature and moisture.

TABLE 5

| | luminescent intensity | 1000 h aging | | |
|---|---|---|---|---|
| | | light decay | ΔX | ΔY |
| Example 19 | 104 | 3.0% | −0.015 | 0.012 |
| Example 20 | 102 | 3.2% | −0.014 | 0.011 |
| Example 21 | 103 | 3.2% | −0.015 | 0.012 |
| comparative example 5 | 100 | 6.5% | −0.028 | 0.022 |

Example 22

7.025 g of $Ca_3N_2$, 5.903 g of AlN, 6.735 g of $Si_3N_4$, 0.203 g of $Eu_2O_3$, and 0.134 g of $Dy_2O_3$ were weighted. These starting materials were thoroughly mixed in a nitrogen atmosphere for 3 h and charged into an Mo crucible, which was rapidly transferred to a tubular furnace, and then the temperature was gradually raised to 1880° C. under a nitrogen atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 4.56 μs/cm, and after drying, the temperature was raised to 280° C. in a nitrogen-oxygen mixture atmosphere (in which the volume percent of oxygen is 8%) for calcination for 10 h, to give a nitrogen-containing luminescent particle product. The chemical composition of the oxygen poor zone of the nitrogen-containing luminescent particle is $Ca_{0.987}AlSiN_3$:0.008Eu, 0.005Dy, the chemical composition of the transition zone is $Ca_{0.987}AlSi_{0.08}N_{2.2}$:0.008Eu, 0.005Dy, with a thickness of 390 nm, and the chemical composition of the oxygen rich zone is $Ca_{0.987}AlSi_{0.8}O_{4.1}$:0.008Eu, 0.005Dy, with a thickness of 28 nm.

Example 23

7.032 g of $Ca_3N_2$, 5.909 g of AlN, 6.741 g of $Si_3N_4$, 0.203 g of $Eu_2O_3$, and 0.115 g of $Lu_2O_3$ were weighted. These starting materials were thoroughly mixed in a nitrogen atmosphere for 3 h and charged into an Mo crucible, which was rapidly transferred to a tubular furnace, and then the temperature was gradually raised to 1880° C. under a nitrogen atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 5.66 μs/cm, and after drying, the temperature was raised to 280° C. in a nitrogen-oxygen mixture atmosphere (in which the volume percent of oxygen is 8%) for calcination for 10 h, to give a nitrogen-containing luminescent particle product. The chemical composition of the oxygen poor zone of the nitrogen-containing luminescent particle is $Ca_{0.988}AlSiN_3$:0.008Eu, 0.004Lu, the chemical composition of the transition zone is $Ca_{0.988}AlSiO_{0.9}N_{2.4}$:0.008Eu, 0.004Lu, with a thickness of 465 nm, and the chemical composition of the oxygen rich zone is $Ca_{0.988}AlSiO_{4.5}$:0.008Eu, 0.004Lu, with a thickness of 38 nm.

Example 24

7.034 g of $Ca_3N_2$, 5.911 g of AlN, 6.743 g of $Si_3N_4$, 0.203 g of $Eu_2O_3$, and 0.109 g of $Ho_2O_3$ were weighted. These starting materials were thoroughly mixed in a nitrogen atmosphere for 3 h and charged into an Mo crucible, which was rapidly transferred to a tubular furnace, and then the temperature was gradually raised to 1880° C. under a nitrogen atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 3.87 μs/cm, and after drying, the temperature was raised to 280° C. in a nitrogen-oxygen mixture atmosphere (in which the volume percent of oxygen is 8%) for calcination for 10 h, to give a nitrogen-containing luminescent particle product. The chemical composition of the oxygen poor zone of the nitrogen-containing luminescent particle is $Ca_{0.988}AlSiN_3$: 0.008Eu, 0.004Ho, the chemical composition of the transition zone is $Ca_{0.988}AlSi_{0.875}O_{0.5}N_{2.5}$:0.008Eu, 0.004Ho, with a thickness of 390 nm, and the chemical composition of the oxygen rich zone is $Ca_{0.988}AlSi_{0.65}O_{3.8}$:0.008Eu, 0.004Ho, with a thickness of 37 nm.

Example 25

7.033 g of $Ca_3N_2$, 5.91 g of AlN, 6.743 g of $Si_3N_4$, 0.203 g of $Eu_2O_3$, and 0.111 g of $Ho_2O_3$ were weighted. These starting materials were thoroughly mixed in a nitrogen atmosphere for 3 h and charged into an Mo crucible, which was rapidly transferred to a tubular furnace, and then the temperature was gradually raised to 1880° C. under a nitrogen atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 4.89 μs/cm, and after drying, the temperature was raised to 280° C. in a nitrogen-oxygen mixture atmosphere (in which the volume percent of oxygen is 8%) for calcination for 10 h, to give a nitrogen-containing luminescent particle product. The chemical composition of the oxygen poor zone of the nitrogen-containing luminescent particle is $Ca_{0.987}AlSiN_3$: 0.008Eu, 0.005Ce, the chemical composition of the transition zone is $Ca_{0.987}AlSiO_{1.2}N_{2.2}$:0.008Eu, 0.005Ce, with a thickness of 350 nm, and the chemical composition of the oxygen rich zone is $Ca_{0.987}AlSiO_{4.5}$:0.008Eu, 0.005Ce, with a thickness of 15 nm.

Comparative Example 6

7.095 g of $Ca_3N_2$, 5.933 g of AlN, 6.768 g of $Si_3N_4$, and 0.204 g of $Eu_2O_3$ were weighted. These starting materials were thoroughly mixed in a nitrogen atmosphere for 3 h and charged into an Mo crucible, which was rapidly transferred to a tubular furnace, and then the temperature was gradually raised to 1880° C. under a nitrogen atmosphere for 12 h; the resulting nitrogen-containing luminescent particle was pulverized and sieved, the sieved nitrogen-containing luminescent particle was placed into deionized water and stirred for 30 min, then suction-filtered, and finally washed to a conductivity of 5.58 μs/cm, and after drying, a nitrogen-containing luminescent particle product was obtained. The chemical composition of the nitrogen-containing luminescent particle is $Ca_{0.992}AlSiN_3$:0.008Eu.

The nitrogen-containing luminescent particles in the examples and the comparative example as described above were made into a luminescent device respectively, and the testing results show that the luminescent intensity and the aging properties of the comparative example 6 are lower than those of the examples 22-25, as shown in Table 6. The aging conditions are: SMD 2835 LED Lamp Bead, chip size 10×30 mil, chip band 452.5-455 nm, current 150 mA, power 0.5 W, ambient conditions: normal temperature and moisture.

TABLE 6

| | luminescent intensity | 1000 h aging | | |
|---|---|---|---|---|
| | | light decay | ΔX | ΔY |
| Example 22 | 103 | 2.3% | −0.009 | 0.008 |
| Example 23 | 101 | 2.5% | −0.01 | 0.009 |
| Example 24 | 104 | 2.5% | −0.01 | 0.008 |
| Example 25 | 102 | 2.4% | −0.008 | 0.007 |
| comparative example 6 | 100 | 3.8% | −0.02 | 0.016 |

The contents not specifically described in the specific embodiments of the present invention are known in the art and may be implemented with reference to known techniques.

The present invention has been verified via repeated tests, and satisfactory test results are achieved.

The specific embodiments and examples above are provided to support the technical concepts of a nitrogen-containing luminescent particle and method for preparing a same, a nitrogen-containing illuminant, and a luminescent device of the present invention, and are not intended to limit the scope of protection of the present invention. Any equivalent modification or variations made based on the present technical solution following the technical concepts of the present invention, all fall within the scope of protection of the present invention.

What is claimed is:

1. A nitrogen-containing luminescent particle, wherein a structure of the nitrogen-containing luminescent particle is divided into an oxygen poor zone, a transition zone, and an oxygen rich zone from a core to an outer surface of the particle depending on an increasing oxygen content, the oxygen poor zone being predominantly a nitride luminescent crystal or oxygen-containing solid solution thereof, the transition zone being predominantly a nitroxide material, the oxygen rich zone being predominantly an oxide material or oxynitride material; the nitride luminescent crystal or oxygen-containing solid solution thereof has a chemical formula of $M_{m-m1}A_{a1}B_{b1}O_{o1}N_{n1}:R_{m1}$, the nitroxide material has a chemical formula of $M_{m-m2}A_{a2}B_{b2}O_{o2}N_{n2}:R_{m2}$, the oxide material or oxynitride material has a chemical formula of $M_{m-m3}A_{a3}B_{b3}O_{o3}N_{n3}:R_{m3}$; in the chemical formulas, the M element is at least one of Mg, Ca, Sr, Ba, Zn, Li, Na, K, Y, and Sc, the A element is at least one of B, Al, Ga, and In, the B element is at least one of C, Si, Ge, and Sn, R is at least one of Ce, Pr, Nd, Sm, Eu, Gd, Tb, Dy, Ho, Er, Tm, Yb, and Lu, wherein $0.5 \leq m \leq 1.5$, $0.001 \leq m1 \leq 0.2$, $0.5 \leq a1 \leq 1.5$, $0.5 \leq b1 \leq 1.5$, $0 \leq o1 \leq 0.5$, $2.5 \leq n1 \leq 3.5$, $0 \leq m2 \leq 0.2$, $0.5 \leq a2 \leq 1.5$, $0.5 \leq b2 \leq 1.5$, $0.1 \leq o2 \leq 4$, $0.1 \leq n2 \leq 3$, $0 \leq m3 \leq 0.2$, $0.5 \leq a3 \leq 1.5$, $0.5 \leq b3 \leq 1.5$, $3 \leq o3 \leq 5$, $0 \leq n3 \leq 0.5$.

2. The nitrogen-containing luminescent particle of claim 1, wherein the transition zone has a thickness ranging from 50-500 nm, the oxygen rich zone is at the outer side of the transition zone and has a thickness of no more than 50 nm, and the oxygen poor zone is from the inner side of the transition zone to the core of the nitrogen-containing luminescent particle.

3. The nitrogen-containing luminescent particle of claim 1, wherein the nitride luminescent crystal or oxygen-containing solid solution thereof in the oxygen poor zone has a content of no less than 90%, the nitroxide material in the transition zone has a content of no less than 60%, and the oxide material or oxynitride material in the oxygen rich zone has a content of no less than 50%.

4. The nitrogen-containing luminescent particle of claim 1, wherein the nitride luminescent crystal is at least one of $(Sr_xCa_{1-x-y1})AlSiN_3$:y1Eu or an oxygen-containing solid solution thereof, the nitroxide material is $(Sr_xCa_{1-x-y1})AlSiN_{3-z1}O_{1.5z1}$:y1Eu, and the oxide material or oxynitride material is $(Sr_xCa_{1-x-y1})AlSiO_{4.5-z2}N_{z2}$:y1Eu, wherein $0 \leq x \leq 0.99$, $0.001 \leq y1 \leq 0.2$, $0 \leq z1 \leq 3$, $0 \leq z2 \leq 0.5$.

5. The nitrogen-containing luminescent particle of claim 1, wherein the oxygen poor zone further comprises a nitroxide luminescent crystal, the transition zone further comprises a nitride material, and the oxygen rich zone further comprises a nitroxide material.

6. The nitrogen-containing luminescent particle of claim 1, wherein it is excited at an excitation wavelength ranging from 300-500 nm to emit red light having a peak wavelength at 600-670 nm.

7. A nitrogen-containing illuminant, comprising: a mixture of the nitrogen-containing luminescent particles of claim 1 and other crystalline grains or non-crystalline particles, wherein the nitrogen-containing luminescent particles are present in the mixture at a proportion of no less than 50 wt %.

8. A method for preparing the nitrogen-containing luminescent particle comprising:
    step 1: weighting desired starting materials at a stoichiometric ratio of cations in the composition of a chemical formula $M_{m-m1}A_{a1}B_{b1}O_{o1}N_{n1}:R_{m1}$, with a nitride, oxide or halide of M, A, B, and R as starting materials, wherein $0.5 \leq m \leq 1.5$, $0.001 \leq m1 \leq 0.2$, $0.5 \leq a1 \leq 1.5$, $0.5 \leq b1 \leq 1.5$, $0 \leq o1 \leq 0.5$, $2.5 \leq n1 \leq 3.5$, the M element is at least one of Mg, Ca, Sr, Ba, Zn, Li, Na, K, Y, and Sc, the A element is at least one of B, Al, Ga, and In, the B element is at least one of C, Si, Ge, and Sn, R is at least one of Ce, Pr, Nd, Sm, Eu, Gd, Tb, Dy, Ho, Er, Tm, Yb, and Lu;
    step 2: uniformly mixing the starting materials weighted in the step 1 in a nitrogen atmosphere to form a mix;
    step 3: subjecting the mix obtained in the step 2 to high-temperature calcination in a calcination atmosphere, followed by low-temperature calcination at a reduced predetermined temperature in a nitrogen-oxygen mixture or air atmosphere, to give a nitrogen-containing luminescent particle semi-product; wherein, the high-temperature calcination has a temperature of 1400-2000° C. and a duration of 6-18 h, the atmosphere of the high-temperature calcination is a nitrogen atmosphere, a nitrogen-argon mixture atmosphere, another inert gas atmosphere, a nitrogen-hydrogen mixture atmosphere, or another reducing gas atmosphere, the pressure of the high-temperature calcination is 1-100 atm, the low-temperature calcination has a temperature of 200-450° C. and a duration of 1-24 h; the feeding rate of the nitrogen-oxygen mixture or air in the low-temperature calcination is 0.1-10 L/min; and the volume percent of oxygen in the nitrogen-oxygen mixture atmosphere is no more than 20%; and
    step 4: subjecting the nitrogen-containing luminescent particle semi-product obtained in the step 3 to a post-treatment, to give a nitrogen-containing luminescent particle product; wherein in, the post-treatment comprises grinding, screening, washing, drying, wherein the washing is performed to obtain the nitrogen-containing luminescent particle product having a conductivity of less than 10 μs/cm.

9. A method for preparing the nitrogen-containing luminescent particle comprising:
    step 1: weighting desired starting materials at a stoichiometric ratio of cations in the composition of a chemical formula $M_{m-m1}A_{a1}B_{b1}O_{o1}N_{n1}:R_{m1}$, with a nitride, oxide or halide of M, A, B, and R as starting materials, wherein $0.5 \leq m \leq 1.5$, $0.001 \leq m1 \leq 0.2$, $0.5 \leq a1 \leq 1.5$, $0.5 \leq b1 \leq 1.5$, $0 \leq o1 \leq 0.5$, $2.5 \leq n1 \leq 3.5$, the M element is at least one of Mg, Ca, Sr, Ba, Zn, Li, Na, K, Y, and Sc, the A element is at least one of B, Al, Ga, and In, the B element is at least one of C, Si, Ge, and Sn, R is at least one of Ce, Pr, Nd, Sm, Eu, Gd, Tb, Dy, Ho, Er, Tm, Yb, and Lu;
    step 2: uniformly mixing the starting materials weighted in the step 1 in a nitrogen atmosphere to form a mix;
    step 3: subjecting the mix obtained in the step 2 to high-temperature calcination in a calcination atmosphere, to give a nitrogen-containing luminescent particle semi-product; wherein, the high-temperature calcination has a temperature of 1400-2000° C. and a duration of 6-18 h, the atmosphere of the high-temperature calcination is a nitrogen atmosphere, a nitrogen-argon mixture atmosphere, another inert gas atmosphere, a nitrogen-hydrogen mixture atmosphere, or another reducing gas atmosphere, the pressure of the high-temperature calcination is 1-100 atm;
    step 4: subjecting the nitrogen-containing luminescent particle semi-product obtained in the step 3 to a post-treatment, wherein in, the post-treatment comprises grinding, screening, washing, drying, wherein the washing is performed to obtain the nitrogen-containing luminescent particle product having a conductivity of less than 10 μs/cm; and
    step 5: subjecting the nitrogen-containing luminescent particle obtained in the step 4 to low-temperature calcination in a nitrogen-oxygen mixture or air atmosphere, to give a nitrogen-containing luminescent particle product, wherein in, the low-temperature calcination has a temperature of 200-450° C. and a duration of 1-24 h and the volume percent of oxygen in the nitrogen-oxygen mixture atmosphere is no more than 20%.

10. A luminescent device, characterized by at least comprising an LED chip emitting UV light, violet light or blue light, and a fluorescent powder, wherein the fluorescent powder comprises: a nitrogen-containing luminescent particle, characterized in that a structure of the nitrogen-containing luminescent particle is divided into an oxygen poor zone, a transition zone, and an oxygen rich zone from a core to an outer surface of the particle depending on an increasing oxygen content, the oxygen poor zone being predominantly a nitride luminescent crystal or oxygen-containing solid solution thereof, the transition zone being predominantly a nitroxide material, the oxygen rich zone being predominantly an oxide material or oxynitride material; the nitride luminescent crystal or oxygen-containing solid solution thereof has a chemical formula of $M_{m-m1}A_{a1}B_{b1}O_{o1}N_{n1}:R_{m1}$, the nitroxide material has a chemical formula of $M_{m-m2}A_{a2}B_{b2}O_{o2}N_{n2}:R_{m2}$, the oxide material or oxynitride material has a chemical formula of $M_{m-m3}A_{a3}B_{b3}O_{o3}N_{n3}:R_{m3}$; in the chemical formulas, the M element is at least one of Mg, Ca, Sr, Ba, Zn, Li, Na, K, Y, and Sc, the A element is at least one of B, Al, Ga, and In, the B element is at least one of C, Si, Ge, and Sn, R is at least one of Ce, Pr, Nd, Sm, Eu, Gd, Tb, Dy, Ho, Er, Tm, Yb, and Lu, wherein $0.5 \leq m \leq 1.5$, $0.001 \leq m1 \leq 0.2$, $0.5 \leq a1 \leq 1.5$, $0.5 \leq b1 \leq 1.5$, $0 \leq o1 \leq 0.5$, $2.5 \leq n1 \leq 3.5$, $0 \leq m2 \leq 0.2$, $0.5 \leq a2 \leq 1.5$, $0.5 \leq b2 \leq 1.5$, $0.1 \leq o2 \leq 4$, $0.1 \leq n2 \leq 3$, $0 \leq m3 \leq 0.2$, $0.5 \leq a3 \leq 1.5$, $0.5 \leq b3 \leq 1.5$, $3 \leq o3 \leq 5$, $0 \leq n3 \leq 0.5$.

11. A luminescent device, characterized by at least comprising an LED chip emitting UV light, violet light or blue light, and a fluorescent powder, wherein the fluorescent powder at least uses the nitrogen-containing illuminant of claim 7.

12. The luminescent device of claim 11, wherein further comprising other types of fluorescent powders, so as to meet lighting requirements or applications in high-color-rendering white light LEDs in the backlight, by complementation of luminescent colors.

* * * * *